(12) United States Patent
Nakatani et al.

(10) Patent No.: US 11,323,067 B2
(45) Date of Patent: May 3, 2022

(54) OSCILLATOR CIRCUIT AND SEMICONDUCTOR INTEGRATED CIRCUIT

(71) Applicant: Winbond Electronics Corp., Taichung (TW)

(72) Inventors: Masafumi Nakatani, Yokohama (JP); Hiroki Murakami, Yokohama (JP)

(73) Assignee: WINDBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/235,270

(22) Filed: Apr. 20, 2021

(65) Prior Publication Data
US 2021/0328548 A1 Oct. 21, 2021

(30) Foreign Application Priority Data

Apr. 20, 2020 (JP) .............................. JP2020-074621

(51) Int. Cl.
*H03B 5/04* (2006.01)
*G05F 3/26* (2006.01)
*H03K 3/0232* (2006.01)
*H03K 3/011* (2006.01)
*H03K 3/0231* (2006.01)
(Continued)

(52) U.S. Cl.
CPC .............. *H03B 5/04* (2013.01); *G05F 1/561* (2013.01); *G05F 1/573* (2013.01); *G05F 3/26* (2013.01); *G05F 3/262* (2013.01); *H03K 3/011* (2013.01); *H03K 3/0231* (2013.01); *H03K 3/0232* (2013.01); *H03K 5/135* (2013.01)

(58) Field of Classification Search
CPC .... H03K 3/0232; H03K 3/0231; H03K 3/011; H03K 5/135; G05F 1/581; G05F 1/573; G05F 3/262; G05F 1/561; G05F 3/26; H03B 5/04

USPC .......................................... 331/185, 183, 175
See application file for complete search history.

(56) References Cited

U.S. PATENT DOCUMENTS

| 2014/0312981 A1* | 10/2014 | Nakamura | ............. H03L 7/099 331/34 |
| 2016/0069939 A1 | 3/2016 | Zhang et al. | |
| 2017/0093334 A1* | 3/2017 | Takada | ...................... H03L 7/00 |

FOREIGN PATENT DOCUMENTS

| CN | 102638224 A | 8/2012 |
| JP | 2003-101389 A | 4/2003 |

(Continued)

*Primary Examiner* — Arnold M Kinkead
(74) *Attorney, Agent, or Firm* — Birch, Stewart, Kolasch & Birch, LLP

(57) ABSTRACT

The present invention provides an oscillator circuit and a semiconductor integrated circuit, which can suppress the upper limit of the frequency of a clock signal due to an error of the constant current circuit. The oscillator circuit of the present invention includes a constant current circuit, an oscillator, and a current limiting circuit. The constant current circuit generates a first output current according to a supply voltage. The current limiting circuit receives the first output current and generates a second output current, and establishes an upper limit for the second output current when the supply voltage drops below a lower limit of a guaranteed operational range of the constant current circuit. The oscillator generates a clock signal according to the second output current. By establishing the upper limit for the second output current, the upper limit of the frequency of the clock signal can be suppressed.

18 Claims, 6 Drawing Sheets

(51) Int. Cl.
  *G05F 1/573* (2006.01)
  *H03K 5/135* (2006.01)
  *G05F 1/56* (2006.01)

(56) References Cited

FOREIGN PATENT DOCUMENTS

| | | |
|---|---|---|
| JP | 2005-234890 A | 9/2005 |
| JP | 2007-74190 A | 3/2007 |
| JP | 2013-38744 A | 2/2013 |
| JP | 2013-97751 A | 5/2013 |
| JP | 2014-75744 A | 4/2014 |
| JP | 2017-69825 A | 4/2017 |
| TW | 201722064 A | 6/2017 |

* cited by examiner

US 11,323,067 B2

OSCILLATOR CIRCUIT AND SEMICONDUCTOR INTEGRATED CIRCUIT

CROSS REFERENCE TO RELATED APPLICATIONS

The present application is based on, and claims priority from, Japan Application Serial Number 2020-074621, filed on Apr. 20, 2020, the disclosure of which is hereby incorporated by reference herein in its entirety.

BACKGROUND OF THE INVENTION

Field of the Invention

The present invention relates to an oscillator circuit, and more particularly, to an oscillator circuit using a constant current circuit.

Description of the Related Art

A variety of technologies or applications of constant current circuits have been described in conventional technologies. For example, Japanese Application JP2005234890A discloses using a current mirror circuit for the constant current circuit. Japanese Application JP2013097751A discloses a constant current circuit outputting a constant current without dependency on the supply voltage. In addition, Japanese Application JP2017069825A discloses an oscillator circuit that uses a constant current circuit (implemented by a V/I converting circuit).

FIG. 1 shows a conventional constant current circuit 10 including an operational amplifier OP, PMOS transistors PMOS1 and PMOS2 and a variable resistor $R_T$. The node N is located between the PMOS transistor PMOS1 and the variable resistor $R_T$. The inverting input terminal (−) of the operational amplifier OP receives the reference voltage $V_{REF}$, and the non-inverting input terminal (+) of the operational amplifier OP receives the voltage $V_N$ at the node N. The transistor PMOS1 and the variable resistor $R_T$ are connected in series between the supply voltage VDD and the ground potential GND, and the gate of the transistor PMOS1 is connected to the output of the operational amplifier OP. The variable resistor $R_T$ is configured to fine-tune its resistance value according to such as the tolerance of the circuit element. The operational amplifier OP controls the gate voltage of the transistor PMOS1, so that the voltage $V_N$ at the node N is equal to the reference voltage $V_{REF}$ ($V_N=V_{REF}$). In other words, the operational amplifier OP operates as the unity gain buffer. Therefore, the reference current flowing through the transistor PMOS1 is represented by $I_{REF}=V_{REF}/R_T$, and the reference current $I_{REF}$ becomes the constant current without dependency on the change of the supply voltage. In addition, the output of the operational amplifier OP can be connected to the gate of the transistor PMOS2, which forms a current mirror circuit with the transistor PMOS1. This way, the transistor PMOS2 can generate an output current $I_{MIRROR}$ in accordance with the current $I_{REF}$ flowing through the transistor PMOS1, and the output current $I_{MIRROR}$ can be provided to the load.

FIG. 2 shows an example of an oscillator circuit using the constant current circuit 10 shown in FIG. 1. The oscillator circuit 20 comprises a pair of delay circuits 22 and 24 and a flip-flop circuit 26. The transistor PMOS2 of the constant current circuit 10 (shown in FIG. 3A) provides the output current $I_{MIRROR}$ to first input terminals of the delay circuits 22 and 24. The output OUT1 of the delay circuit 22 is connected to the input S of the flip-flop circuit 26, and the output OUT2 of the delay circuit 24 is connected to the input R of the flip-flop circuit 26. The output Q of the flip-flop circuit 26 is connected to the second input terminal of the delay circuit 22 and the output $\overline{Q}$ of the flip-flop circuit 26 is connected to the second input terminal of the delay circuit 24, and the clock signal CLK is generated at the output Q. The output $\overline{Q}$ is inverted from the output Q.

FIG. 3B is the operation waveform of the voltage at the input IN of the delay circuit 22 in accordance with time. FIG. 3C is the operation waveform of the voltage at the node N3 of the delay circuit 22 in accordance with time. FIG. 3D is the operation waveform of the voltage at the output OUT1 of the delay circuit 22 in accordance with time. As shown in FIG. 3A, the delay circuit 22 comprises an N-type transistor NMOS1, a capacitor C and a comparator CMP. The transistor PMOS2 of the constant current circuit 10 and the transistor NMOS1 of the delay circuit 22 are connected in series between the supply voltage VDD and the ground potential GND. The output current $I_{MIRROR}$ generated by the transistor PMOS2 of the constant current circuit 10 is provided to the node N3 located between the transistor PMOS2 and the transistor NMOS1. The capacitor C and the comparator CMP are connected to the node N3. In detail, the inverting input terminal (−) of the comparator CMP receives the reference voltage $V_{REF}$, and the non-inverting input terminal (+) of the comparator CMP receives the voltage at the node N3. The comparator CMP is configured to compare the voltage at the node N3 with the reference voltage $V_{REF}$, when the voltage at the node N3 is lower than or equal to the reference voltage $V_{REF}$, the comparator CMP outputs the L level; when the voltage at the node N3 is higher than the reference voltage $V_{REF}$, the comparator CMP outputs the H level. The output OUT1 of the comparator CMP is connected to the input S of the flip-flop circuit 26; the output Q of the flip-flop circuit 26 is applied to the gate of the transistor NMOS1 as the input IN. The configuration of the delay circuit 24 is the same as that of the delay circuit 22.

In detail, during the period from time t1 to t4, the output Q of the flip-flop circuit 26 is at the L level (i.e. the input IN is at the L level). Accordingly, the transistor NMOS1 is turned off, the capacitor C is connected to the supply voltage VDD via the transistor PMOS2. That is, the capacitor C is charged during the period from time t1 to t4.

Before the time t1, the input IN is at the H level, thereby making the transistor NMOS1 turn on, thus the voltage of the node N3 is discharged to the ground potential GND via the turned-on transistor NMOS1. At this time, the current flowing through the transistor PMOS2 driving by the output voltage Vg of the operational amplifier OP is smaller than the current which can flow through the transistor NMOS1, thus the potential at the node N3 becomes almost equal to the ground potential GND, and the capacitor C is not charged. At the time t1, when the transistor NMOS1 is turned off, the charge will flow from the supply voltage VDD through the transistor PMOS2, and the capacitor C is charged. The charging speed depends on the output current $I_{MIRROR}$ flowing through the transistor PMOS2.

When the capacitor C is charged and the voltage at the node N3 becomes higher than the reference voltage $V_{REF}$, the output OUT1 of the comparator CMP becomes the H level. After that, since the flip-flop circuit 26 receives the output OUT1 at the H level from the comparator CMP, at the time t4, the output Q (i.e. the input IN) of the flip-flop circuit 26 starts to change to the H level, and the transistor NMOS1 is turned on, the capacitor C starts to discharge. When the voltage at the node N3 becomes lower than the reference voltage $V_{REF}$, the output OUT1 of the comparator CMP becomes L level. In addition, from the time t4, since the output Q of the flip-flop circuit 26 starts to change to the L level, the input IN of the delay circuit 24 starts to change to the L level, such that the capacitor C of the delay circuit 24 starts to be charged. This way, a clock signal CLK is generated from the output Q of the flip-flop circuit 26 through the oscillation generated by the delay circuits 22 and 24, which are connected together via the flip-flop circuit 26.

In the constant current circuit 10, if the supply voltage VDD drops very close to the reference voltage $V_{REF}$, the transistor PMOS1 as the output driver of the operational amplifier OP will become unable to operate in the saturation region, making the output voltage Vg of the operational amplifier OP become very low. Therefore, the transistor PMOS2 also becomes unable to keep operating in the saturation region, and it may generate an output current $I_{MIRROR}$ that is not related to the current mirror ratio, and significantly larger than the reference current $I_{REF}$ of the transistor PMOS1.

The output current $I_{MIRROR\_L}$ (dashed line) in FIG. 3C shows the non-ideal case when the output current $I_{MIRROR}$ is significantly larger than the reference current $I_{REF}$. If the output current is increased from $I_{MIRROR\_S}$ to $I_{MIRROR\_L}$, the charging time of the capacitor C will be shorter accordingly. Therefore, as shown in FIG. 3D, in the ideal case (i.e. in the embodiment that the output current $I_{MIRROR\_S}$ is equal to the reference current $I_{REF}$), the output OUT1 of the comparator CMP becomes the H level at the time t3. In contrast, in the non-ideal case (i.e. in the embodiment that the output current $I_{MIRROR\_L}$ is significantly larger than the reference current $I_{REF}$), the output OUT1 of the comparator CMP becomes the H level at the time t2 earlier than the time t3. In other words, comparing to the ideal case, in such the non-ideal case, the delay time caused by the charging of the capacitor C becomes shorter, and the oscillation frequency of the generated clock signal CLK becomes higher. If the frequency of the clock signal CLK generated by the oscillator circuit 20 becomes too high, the operation of the circuit which needs to be synchronized with the clock signal CLK cannot be guaranteed.

BRIEF SUMMARY OF THE INVENTION

The purpose of the present invention is to solve the conventional problems described above, and to provide an oscillator circuit which can suppress the upper limit of the frequency of the clock signal.

The oscillator circuit according to the present invention comprises: a constant current circuit, configured to generate a first output current according to a supply voltage; a current limiting circuit, configured to receive the first output current and generate a second output current, and establish an upper limit for the second output current when the supply voltage drops below a lower limit of a guaranteed operational range of the constant current circuit; and an oscillator, configured to generate a clock signal according to the second output current.

According to the present invention, since the abnormal current is limited when the supply voltage drops below the lower limit of the guaranteed operational range of the constant current circuit, the frequency of the clock signal can be prevented from being higher than the required value.

DETAILED DESCRIPTION OF THE INVENTION

Next, embodiments of the present invention will be described in detail with reference to the drawings. The oscillator circuit of the present invention can be applied to memory devices such as the dynamic random access memory (DRAM), the static random access memory (SRAM), the resistive random access memory (RRAM), and the magnetic random access memory (MRAM); or can be applied to various semiconductor devices such as the logic and the signal processing.

Figure 1:
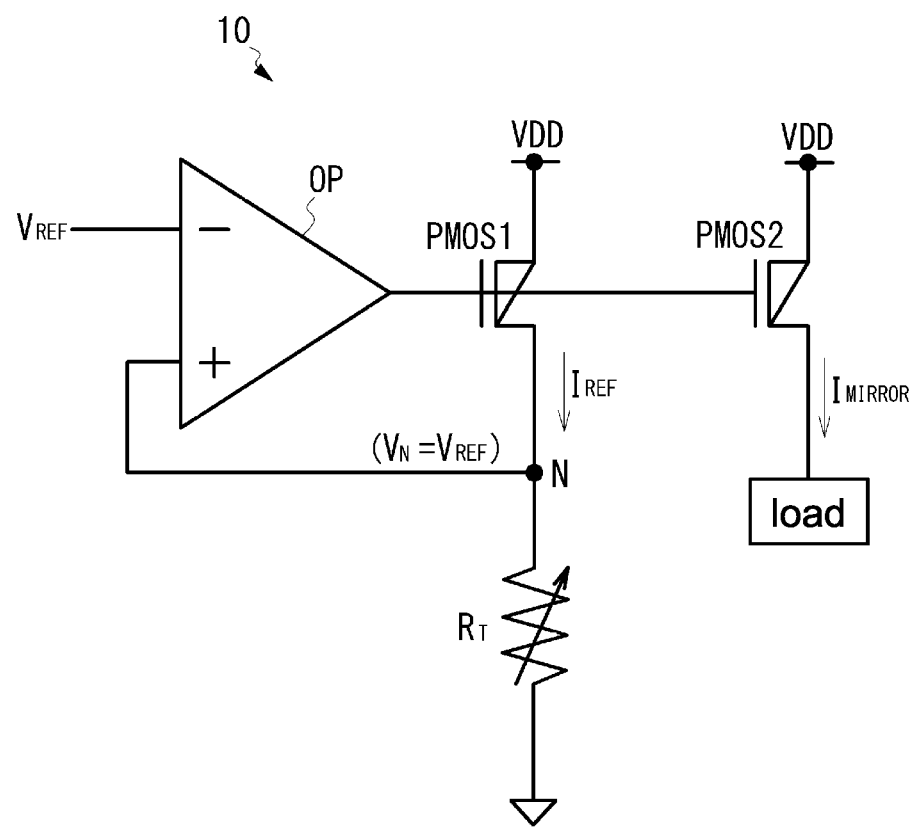
FIG. 1 shows the configuration of the conventional constant current circuit.
Figure 2:
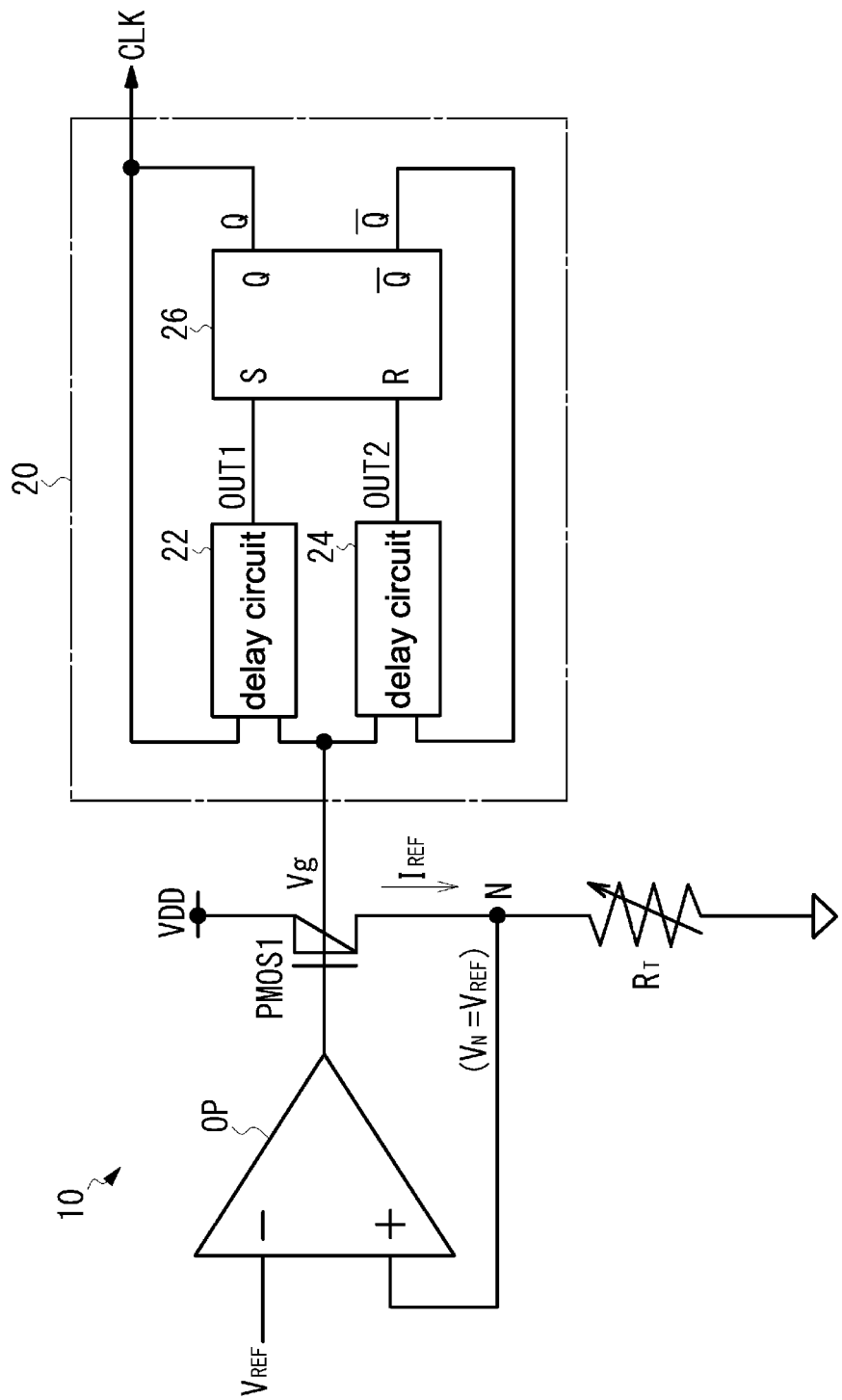
FIG. 2 shows the configuration of the oscillator circuit using the conventional constant current circuit.
Figure 3A:
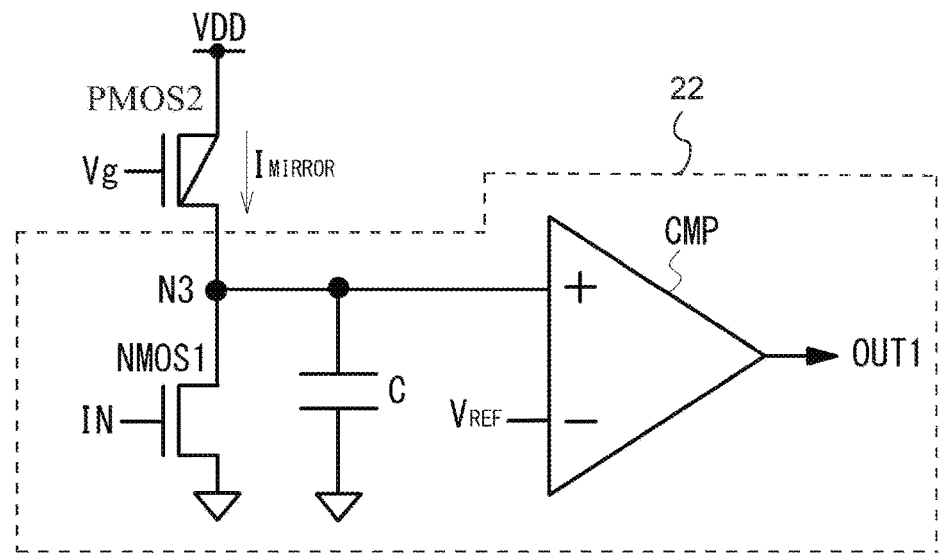
FIG. 3A shows the configuration of the delay circuit of the oscillator.
Figure 3B:
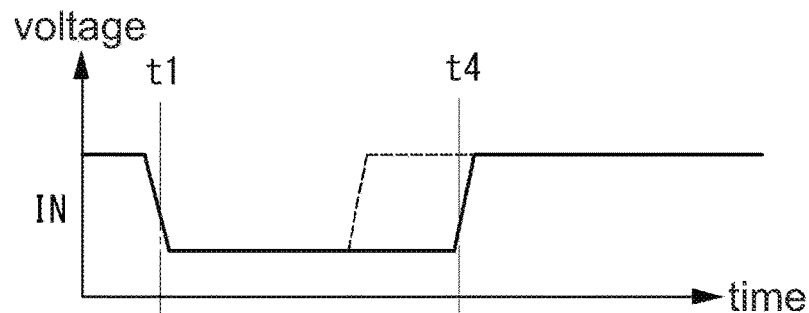
FIGS. 3B-3D show the operation waveforms of the voltages at each node of the delay circuit.
Figure 4:
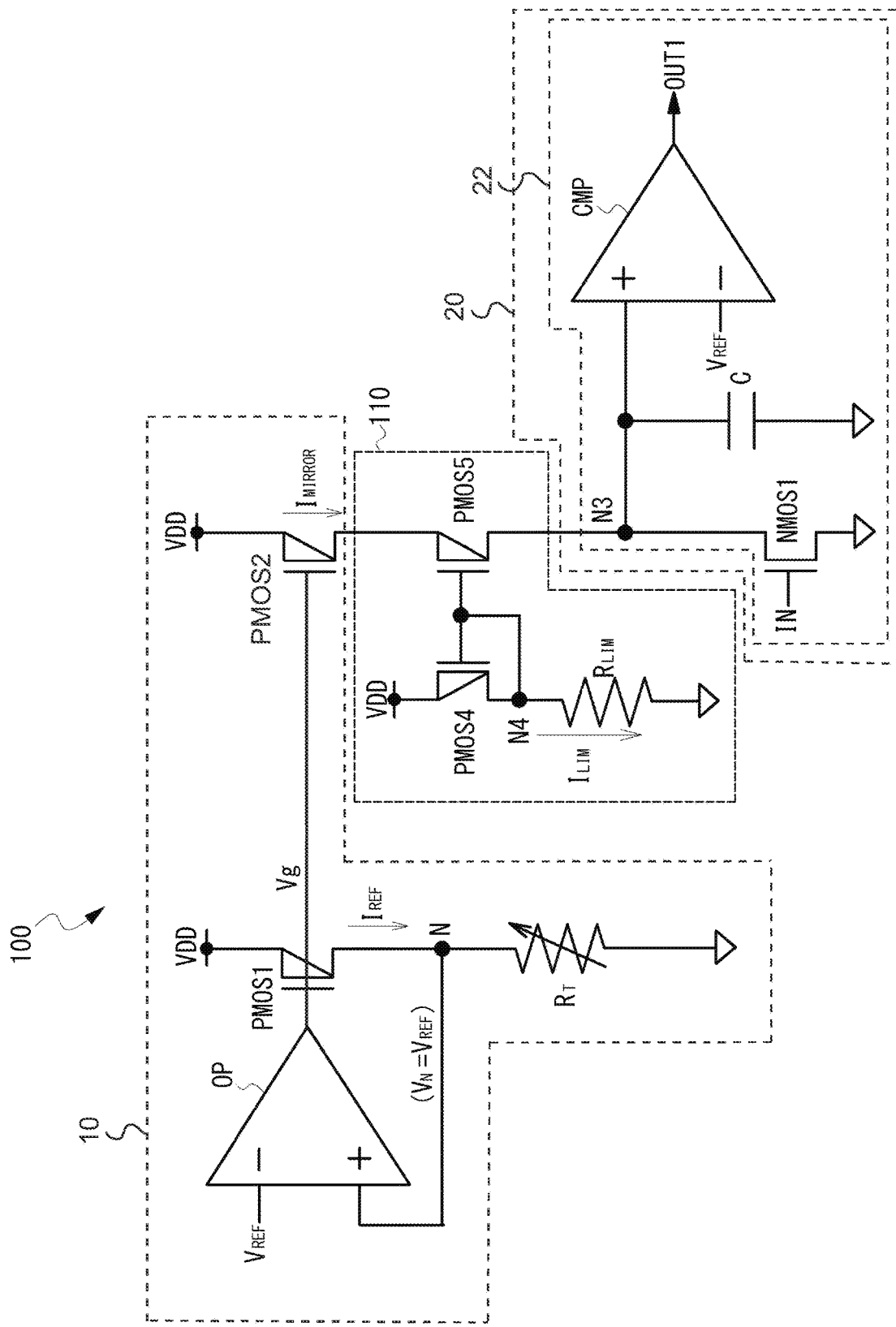
FIG. 4 shows the configuration of an oscillator circuit according to a first embodiment of the present invention.

FIG. 4 shows the configuration of the oscillator circuit of the present embodiment. The same configuration as in FIG. 2 and FIG. 3A is given the same reference number, and the repeated description is omitted.

The oscillator circuit 100 of the present embodiment comprises the constant current circuit 10, a current limiting circuit 110 and the oscillator circuit 20. The current limiting circuit 110 is configured between the constant current circuit 10 and the oscillator circuit 20. Only the delay circuit 22 is shown in the oscillator circuit 20 as the representative, and the other elements of the oscillator circuit 20, such as the delay circuit 24 and the flip-flop circuit 26 are omitted. In one embodiment, the delay circuits 22 and 24 can be commonly connected to one current limiting circuit 110. In another embodiment, the oscillator circuit 100 can comprise two transistors PMOS2 and two current limiting circuits 110. The delay circuit 22 is connected to one of the transistors PMOS2 and one of the current limiting circuits 110 connected in series, and the delay circuit 24 is connected to the other transistor PMOS2 and the other current limiting circuit 110 connected in series.

The current limiting circuit 110 of the present embodiment is configured to establish the upper limit for the frequency of the clock signal CLK generated by the oscillator circuit 20 when the abnormally large constant current flows through the constant current circuit 10. For example, if the supply voltage VDD provided to the constant current circuit 10 drops from the determined supply voltage VDD (for example, 1.8V) very close to the reference voltage $V_{REF}$ (for example, 1.2V generated by the bandgap reference circuit), the output voltage Vg of the operational amplifier OP will become too low, and the transistors PMOS1 and PMOS2 as output drivers will not operate in the saturation region (for example, operate in the linear region). This way, the current mirror circuit formed by the transistors PMOS1 and PMOS2 cannot operate normally, and the output current $I_{MIRROR}$ of the transistor PMOS2 does not follow the current mirror ratio, and may become very large.

As shown in FIG. 3A, each of the delay circuits 22 and 24 of the oscillator circuit 20 comprises a capacitor C. The charging time of the capacitor C depends on the output current $I_{MIRROR}$. If the output current $I_{MIRROR}$ becomes larger, the charging speed becomes faster, the delay time caused by the delay circuits 22 and 24 becomes shorter, and the frequency of the clock signal CLK becomes higher.

The current limiting circuit 110 of the present embodiment is configured to regulate the upper limit of the output current $I_{MIRROR}$ of the constant current circuit 10 when the supply voltage VDD drops. It also prevents the charging time of the capacitor C of the delay circuit 22 from being too short, which can result in the delay time being shorter than a first predetermined value. Therefore, the frequency of the clock signal CLK is not higher than a second predetermined value. This way, the operation of the circuit synchronized with the clock signal CLK from the oscillator circuit 100 can be guaranteed.

As shown in FIG. 4, the current limiting circuit 110 of the present embodiment comprises P-type transistors PMOS4 and PMOS5 and a resistor $R_{LIM}$. The transistor PMOS5 is connected in series between the constant current circuit 10 and the oscillator circuit 20. In the present embodiment, the transistor PMOS5 is connected between the transistor PMOS2 and the transistor NMOS1. The current limiting circuit 110 comprises a current $I_{LIM}$ flowing path located between the supply voltage VDD and the ground potential GND, and the transistor PMOS4 and the resistor $R_{LIM}$ are connected in series in the current $I_{LIM}$ flowing path. The gates of the transistors PMOS4 and PMOS5 are commonly connected to the node N4 located between the transistor PMOS4 and the resistor $R_{LIM}$. The transistors PMOS4 and PMOS5 form a current mirror circuit. According to the present embodiment, the bias of the gate of the transistor PMOS5 is determined by the current $I_{LIM}$ flowing through the transistor PMOS4 and the resistor $R_{LIM}$. Therefore, the current flowing through the transistor PMOS5 is determined by the current $I_{LIM}$. If the supply voltage VDD becomes higher, the current $I_{LIM}$ becomes larger; if the supply voltage VDD becomes lower, the current $I_{LIM}$ becomes smaller. In addition, if the resistance value of the resistor $R_{LIM}$ is adjusted to be smaller, the current $I_{LIM}$ becomes larger; if the resistance value of the resistor $R_{LIM}$ is adjusted to be larger, the current $I_{LIM}$ becomes smaller.

If the supply voltage VDD is significantly higher than the reference voltage $V_{REF}$, that is, the supply voltage VDD satisfies the lower limit of the guaranteed operational range of the constant current circuit 10, the transistor PMOS1 operates in the saturation region, the transistor PMOS2 follows the current mirror ratio to generate the output current $I_{MIRROR}$ in accordance with the reference current $I_{REF}$ flowing through the transistor PMOS1. If the supply voltage VDD drops very close to the reference voltage $V_{REF}$, or even drops below the reference voltage $V_{REF}$ due to some reasons, the transistor PMOS1 operates in the linear region, and the transistor PMOS2 no longer operates as the current mirror of the reference current $I_{REF}$, resulting in a higher output current $I_{MIRROR}$ larger than the reference current $I_{REF}$. By the current limiting circuit 110 of the embodiment, the current provided to the capacitor C can be limited to solve the above-mentioned problem.

The resistor $R_{LIM}$ is a variable resistor. When the supply voltage VDD is lower than the lower limit of the guaranteed operational range of the constant current circuit 10, the current $I_{LIM}$ is adjusted to make sure that the charging time of the capacitor C caused by the drain current flowing through the transistor PMOS5 is not less than a constant time. For example, when the supply voltage VDD is equal to the lower limit of the guaranteed operational range of the constant current circuit 10, the resistor $R_{LIM}$ is configured to adjust the current $I_{LIM}$ being equal to the output current $I_{MIRROR}$. In other words, the adjusted current $I_{LIM}$ is equal to the reference current $I_{REF}$. This way, when the supply voltage VDD is normal, the reference current $I_{REF}$ controls the output current $I_{MIRROR}$. On the other hand, when the supply voltage VDD is lower than the lower limit of the guaranteed operational range of the constant current circuit 10, the output current $I_{MIRROR}$ is suppressed by the current $I_{LIM}$ being smaller than the reference current $I_{REF}$.

Figure 3C:
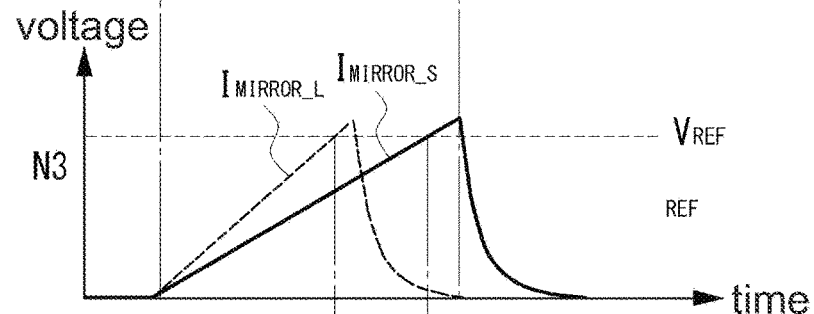
Figure 3D:
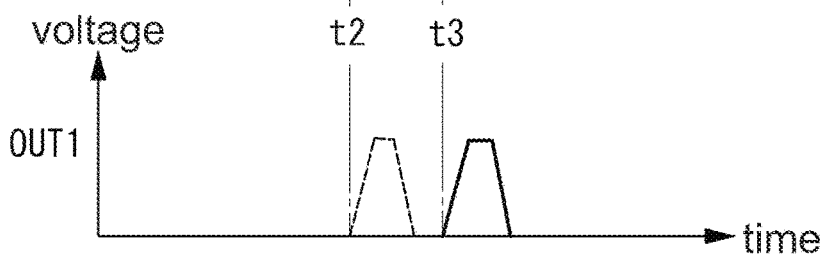

By regulating the upper limit of the output current $I_{MIRROR}$, as shown in FIG. 3C, the voltage shown by the dashed line can be limited to the voltage shown by the solid line, and the upper limit of the frequency of the clock signal is restricted.

During normal operation, the current $I_{LIM}$ of the current limiting circuit 110 is larger than the reference current $I_{REF}$, so the output current $I_{MIRROR}$ generated by the transistor PMOS5 is not limited.

By adjusting the resistance value of the resistor $R_{LIM}$ of the current limiting circuit 110 properly, when the output current $I_{MIRROR}$ of the constant current circuit 10 becomes larger, the current limiting circuit 110 operates as the current limiter, to establish the upper limit for the output current $I_{MIRROR}$, so that the charging time of the capacitor C is not less than a constant time. When the constant current circuit 10 outputs the normal constant current, the current limiting circuit 110 provides the output current $I_{MIRROR}$ in accordance with the reference current $I_{REF}$, and does not operate as the current limiter. This way, when an oscillator circuit uses the constant current circuit of the present embodiment, it is possible to prevent the oscillator from generating an unexpected high-frequency clock signal, and the operation of the circuit synchronized with the clock signal can be guaranteed.

Figure 5:
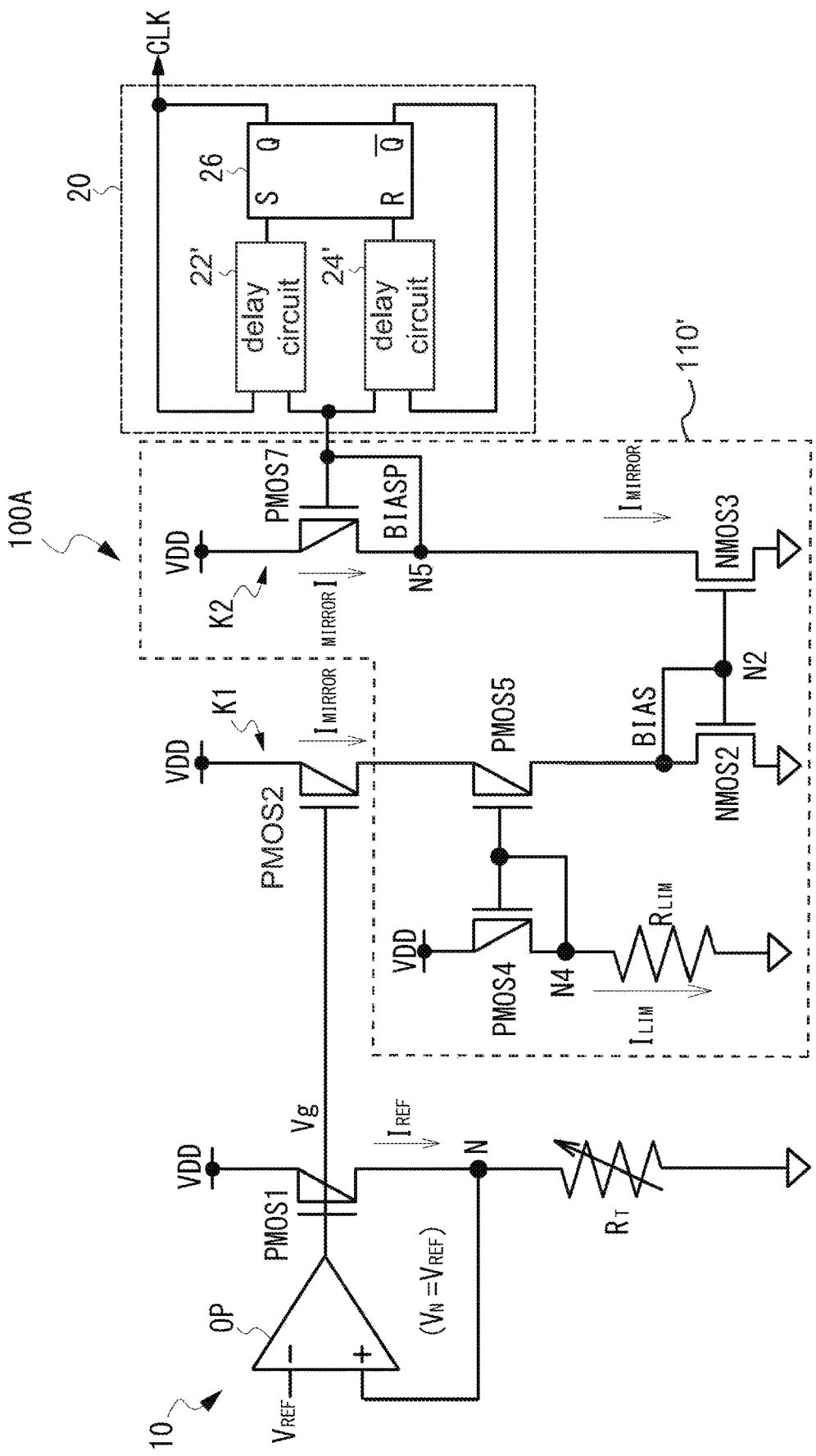
FIG. 5 shows the configuration of the oscillator circuit according to a second embodiment of the present invention.
Figure 6:
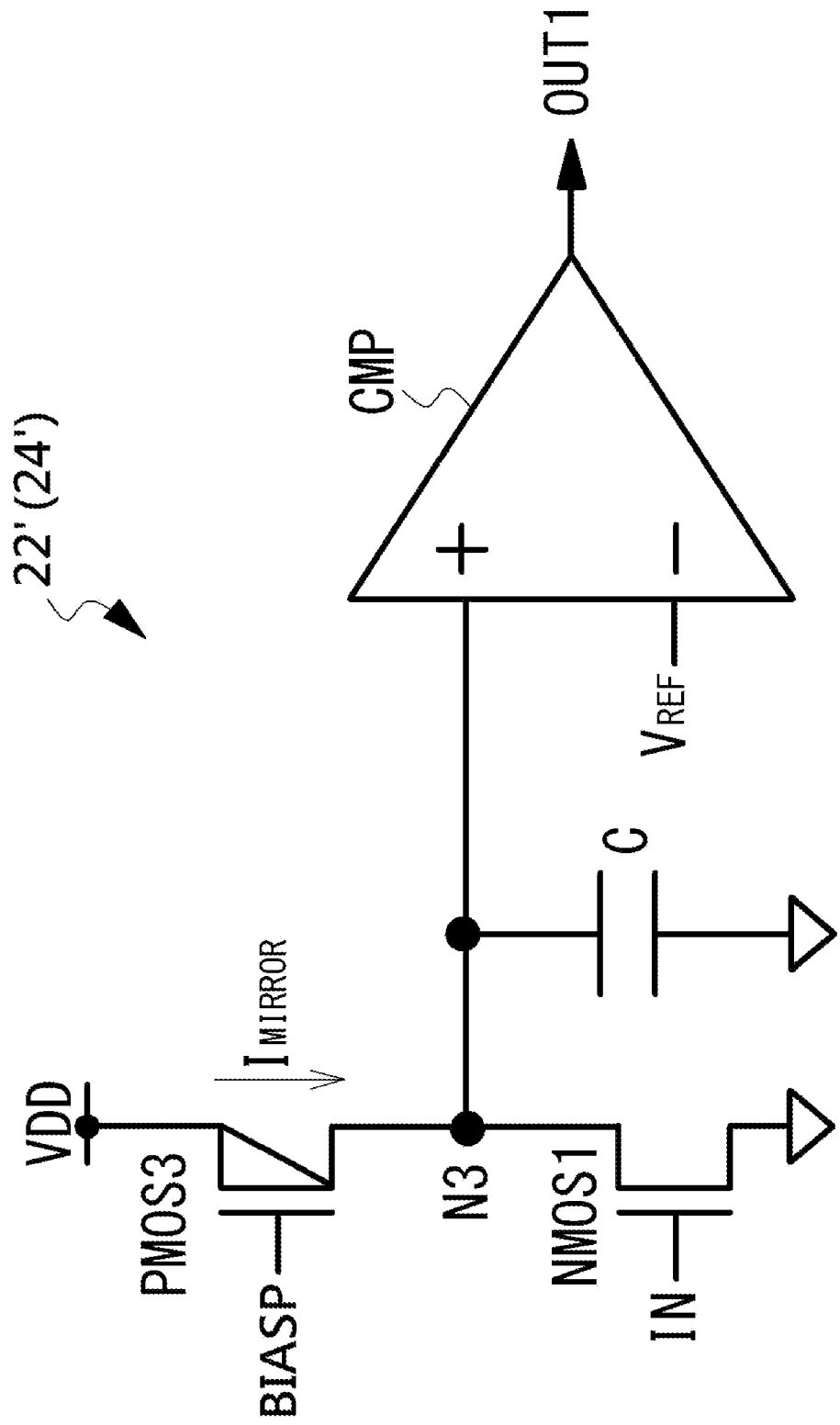
FIG. 6 shows the configuration of the delay circuit of the second embodiment according to the present invention.

FIG. 5 shows the configuration of an oscillator circuit 100A according to a second embodiment of the present invention. FIG. 6 shows the configuration of the delay circuits 22' and 24' of the second embodiment. In FIG. 5 and FIG. 6, the same configuration as in FIG. 2, FIG. 3A and FIG. 4 is given the same reference number, and the repeated description is omitted. According to the oscillator circuit 100A, the current limiting circuit 110' is configured between the constant current circuit 10 and the oscillator circuit 20. The current limiting circuit 110' comprises the P-type transistors PMOS4, PMOS5 and PMOS7, the resistor $R_{LIM}$, and the N-type transistors NMOS2 and NMOS3. The drain of the transistor PMOS5 of the current limiting circuit 110' is connected to the transistor NMOS2. Therefore, a first current path K1 comprises the transistors PMOS2, PMOS5 and NMOS2 connected in series between the supply voltage VDD and the ground potential GND. A bias voltage BIAS for driving the transistor NMOS2 can be generated at the node N2 according to the current flowing from the drain of the transistor PMOS5. Similar to the previous embodiment, when the supply voltage VDD is lower than the guaranteed operational range of the constant current circuit 10, the transistor PMOS2 may generate the excess output current $I_{MIRROR}$. The amount of excess output current $I_{MIRROR}$ output to the oscillator circuit 20 can be limited by the current limiting circuit 110'.

In addition, the transistors PMOS7 and NMOS3 are disposed in the second current path K2 between the supply voltage VDD and the ground potential GND. The gate of the transistor PMOS7 is connected to the gate of a P-type transistor PMOS3 of the oscillator circuit 20 (shown in FIG. 6). That is, the transistors PMOS7 and PMOS3 form a current mirror circuit. The gate of the transistor NMOS2 and the gate of the transistor NMOS3 are commonly connected to the node N2, and the bias voltage BIAS is applied to the node N2. By the current mirror circuit formed by the transistors NMOS2 and NMOS3, the output current $I_{MIRROR}$ flowing through the second current path K2 is regulated by the current $I_{LIM}$. In addition, the bias voltage BIASP can be generated at the node N5 between the transistors PMOS7 and NMOS3 according to the output current $I_{MIRROR}$ flowing through the second current path K2, and the bias voltage BIASP is also applied to the gate of the transistor PMOS7 and the gate of the transistor PMOS3 shown in FIG. 6. This way, the output current $I_{MIRROR}$ flowing through the second current path K2 can regulate the output current $I_{MIRROR}$ flowing through the transistor PMOS3. In other words, the current sources of the delay circuits 22 and 24 are limited to a constant value or less.

When the supply voltage VDD becomes lower than the lower limit of the guaranteed operational range of the constant current circuit 10, the output current $I_{MIRROR}$ in the first current path K1 provided to the transistor NMOS2 is limited by the current $I_{LIM}$ of the current limiting circuit 110'. That is, the bias voltage BIAS is less than or equal to a predetermined value in response to the current $I_{LIM}$. Therefore, the drain current of the transistor NMOS3 establishes the upper limit for the output current $I_{MIRROR}$ in the second current path K2. In response to this, the output current $I_{MIRROR}$ flowing through the transistor PMOS3 of the delay circuit 22' (24') will be less than or equal to a predetermined value, so that the current provided to the node N3 is less than or equal to the predetermined value. This way, the current provided to the capacitor C can be limited, which prevents the charging speed of the capacitor C from being too fast.

According to the present embodiment, it is possible to control the charging time of each capacitor C in a pair of the delay circuits 22' and 24' by one current limiting circuit 110', and it is not necessary to configure each current limiting circuit 110 to the corresponding delay circuits 22 and 24 individually as the first embodiment.

In the above embodiment, the oscillator is designed to comprise a pair of delay circuits and the flip-flop circuit, and the delay circuits are connected together via the flip-flop circuit. However, other well-known structure may also be used. In detail, the current limiting circuit is applied to the oscillator which determines the frequency of the clock signal based on the amount of the current generated by the constant current circuit.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An oscillator circuit, comprising: a constant current circuit, configured to generate a first output current according to a supply voltage; a current limiting circuit, configured to receive the first output current and generate a second output current, and establish an upper limit for the second output current when the supply voltage drops below a lower limit of a guaranteed operational range of the constant current circuit; and an oscillator, configured to generate a clock signal according to the second output current; wherein the constant current circuit comprises: a first current mirror circuit, configured to generate a reference current according to the supply voltage and a resistance value of a first variable resistor, and generate the first output current in a first current path in response to the reference current; wherein the current limiting circuit comprises: a second variable resistor; and a second current mirror circuit, connected to the second variable resistor, and configured to generate an upper limit current in a second current path according to the supply voltage and a resistance value of the second variable resistor, and determine the upper limit of the second output current according to the upper limit current; wherein the current limiting circuit sets the upper limit current to be smaller than the reference current when the supply voltage drops below the lower limit of the guaranteed operational range of the constant current circuit.

2. The oscillator circuit as claimed in claim 1, wherein the second current mirror circuit is configured to provide a first bias voltage according to the reference current or the upper limit current, and the current limiting circuit further comprises: a third current mirror circuit, connected to the second current mirror circuit to receive the first bias voltage, and configured to generate a control current in response to the first bias voltage; and a transistor, connected to the third current mirror circuit and a current source transistor, and configured to form a fourth current mirror circuit with the current source transistor, and generate the second output current according to the control current.

3. The oscillator circuit as claimed in claim 1, wherein the second current mirror circuit comprises: a first transistor, connected to the first current mirror circuit in series, so as to receive the first output current and generate the second output current; and a second transistor, disposed in the second current path, wherein a gate of the first transistor and a gate of the second transistor are commonly connected to a first node located between the second transistor and the second variable resistor.

4. The oscillator circuit as claimed in claim 2, wherein the second current mirror circuit comprises: a first transistor, connected to the first current path in series, and disposed between the first current mirror circuit and the third current mirror circuit to provide the first bias voltage; and a second transistor, disposed in the second current path, wherein a gate of the first transistor and a gate of the second transistor are commonly connected to a first node located between the second transistor and the second variable resistor.

5. The oscillator circuit as claimed in claim 3, wherein the second variable resistor is configured to: make sure that the first transistor does not suppress the first output current when the supply voltage is higher than or equal to the lower limit of the guaranteed operational range of the constant current circuit, and make sure that the first transistor determines the upper limit of the second output current according to the upper limit current when the supply voltage is lower than the lower limit of the guaranteed operational range of the constant current circuit.

6. The oscillator circuit as claimed in claim 1, wherein the current limiting circuit is configured to adjust the resistance value of the second variable resistor so that the upper limit current is larger than or equal to the reference current when the supply voltage is higher than or equal to the lower limit of the guaranteed operational range of the constant current circuit.

7. The oscillator circuit as claimed in claim 3, wherein the oscillator circuit comprises a plurality of current limiting circuits, the oscillator comprises a plurality of delay circuits, and each delay circuit is connected to one of the corresponding current limiting circuits via the first transistor.

8. The oscillator circuit as claimed in claim 3, wherein the oscillator comprises: a delay circuit comprising a capacitor connected to the first transistor, the delay circuit is configured to charge the capacitor according to the second output circuit, to generate a delay time according to a charging time of the capacitor; wherein the oscillator generates the clock signal according to the delay time.

9. The oscillator circuit as claimed in claim 2, wherein the oscillator comprises: a delay circuit comprising a capacitor connected to the current source transistor, the delay circuit is configured to charge the capacitor according to the second output circuit, to generate a delay time according to the charging time of the capacitor; wherein the oscillator generates the clock signal according to the delay time.

10. The oscillator circuit as claimed in claim 2, wherein the current limiting circuit is configured to generate a second bias voltage at a node between the transistor and the third current mirror circuit, and the second bias voltage is provided to a gate of the transistor and a gate of the current source transistor.

11. The oscillator circuit as claimed in claim 1, wherein the oscillator comprises a delay circuit, and the delay circuit comprises: a capacitor; a third transistor, connected to a second node in parallel with the capacitor, and configured to generate a charging voltage at the second node according to the clock signal and the second output current; and a comparator, configured to compare a reference voltage with the charging voltage to generate a comparison result; wherein the oscillator generates the clock signal according to the comparison result.

12. The oscillator circuit as claimed in claim 11, wherein the oscillator comprises two delay circuits and a flip-flop circuit; an output of one delay circuit is connected to a first input terminal of the flip-flop circuit; a first output terminal of the flip-flop circuit is connected to a gate of the third transistor of one delay circuit; an output of the other delay circuit is connected to a second input terminal of the flip-flop circuit; a second output terminal of the flip-flop circuit is connected to a gate of the third transistor of the other delay circuit; and the clock signal is generated from the first output terminal of the flip-flop circuit.

13. The oscillator circuit as claimed in claim 11, wherein the second current mirror circuit is formed by two P-type MOS transistors having gates connected each other, and the third transistor is an N-type MOS transistor.

14. A semiconductor integrated circuit, comprising: the oscillator circuit as claimed in claim 1; and a circuit operating synchronously with the clock signal generated by the oscillator circuit.

15. The semiconductor integrated circuit as claimed in claim 14, wherein the second current mirror circuit is configured to provide a first bias voltage according to the reference current or the upper limit current, and the current limiting circuit further comprises: a third current mirror circuit, connected to the second current mirror circuit to receive the first bias voltage, and configured to generate a control current in response to the first bias voltage; and a transistor, connected to the third current mirror circuit and a current source transistor, and configured to form a fourth current mirror circuit with the current source transistor, and generate the second output current according to the control current.

16. The semiconductor integrated circuit as claimed in claim 14, wherein the second current mirror circuit comprises: a first transistor, connected to the first current mirror circuit in series, so as to receive the first output current and generate the second output current; and a second transistor, disposed in the second current path, wherein a gate of the first transistor and a gate of the second transistor are commonly connected to a first node located between the second transistor and the second variable resistor.

17. The semiconductor integrated circuit as claimed in claim 15, wherein the second current mirror circuit comprises: a first transistor, connected to the first current path in series, and disposed between the first current mirror circuit and the third current mirror circuit to provide the first bias voltage; and a second transistor, disposed in the second current path, wherein a gate of the first transistor and a gate of the second transistor are commonly connected to a first node located between the second transistor and the second variable resistor.

18. The semiconductor integrated circuit as claimed in claim 14, wherein the current limiting circuit is configured to adjust the resistance value of the second variable resistor so that the upper limit current is larger than or equal to the reference current when the supply voltage is higher than or equal to the lower limit of the guaranteed operational range of the constant current circuit.

\* \* \* \* \*